United States Patent [19]
Ohshima

[11] Patent Number: 5,818,785
[45] Date of Patent: Oct. 6, 1998

[54] SEMICONDUCTOR MEMORY DEVICE HAVING A PLURALITY OF BANKS

[75] Inventor: Shigeo Ohshima, Yokohama, Japan

[73] Assignee: Kabushiki Kaisha Toshiba, Tokyo, Japan

[21] Appl. No.: 764,886

[22] Filed: Dec. 16, 1996

[30] Foreign Application Priority Data

Dec. 20, 1995 [JP] Japan .................................... 7-331989

[51] Int. Cl.$^6$ ...................................................... G11C 8/00
[52] U.S. Cl. ................................ 365/230.03; 365/230.06; 365/189.05
[58] Field of Search ......................... 365/230.03, 230.06, 365/230.01, 189.05

[56] References Cited

U.S. PATENT DOCUMENTS 5,229,971  7/1993  Kiryu et al. ........................ 365/230.03
5,404,338  4/1995  Murai et al. ............................. 365/233
5,521,880  5/1996  McClure .............................. 365/230.03

*Primary Examiner*—David C. Nelms
*Assistant Examiner*—Hoai Ho
*Attorney, Agent, or Firm*—Loeb & Loeb LLP

[57] ABSTRACT

A semiconductor memory device having a plurality of banks of memory cells is provided. The device has a data line provided in each of the banks for coupling to one of the memory cells in the corresponding bank. A common data line is shared by the banks, and is selectively coupled to one of the data lines through switches. Additionally, an amplifier is coupled to the common data line to amplify data read from a selected memory cell, and an I/O line is coupled to the amplifier to transmit the amplified data to an outer section. In the device, one of the banks of memory cells is selected by a bank select signal. Therefore, the amplifier is shared by the banks. Further the length of the I/O line can be shortened so that the load on the amplifier can be reduced. Accordingly, chip area is decreased and the speed of the memory device is improved.

28 Claims, 9 Drawing Sheets

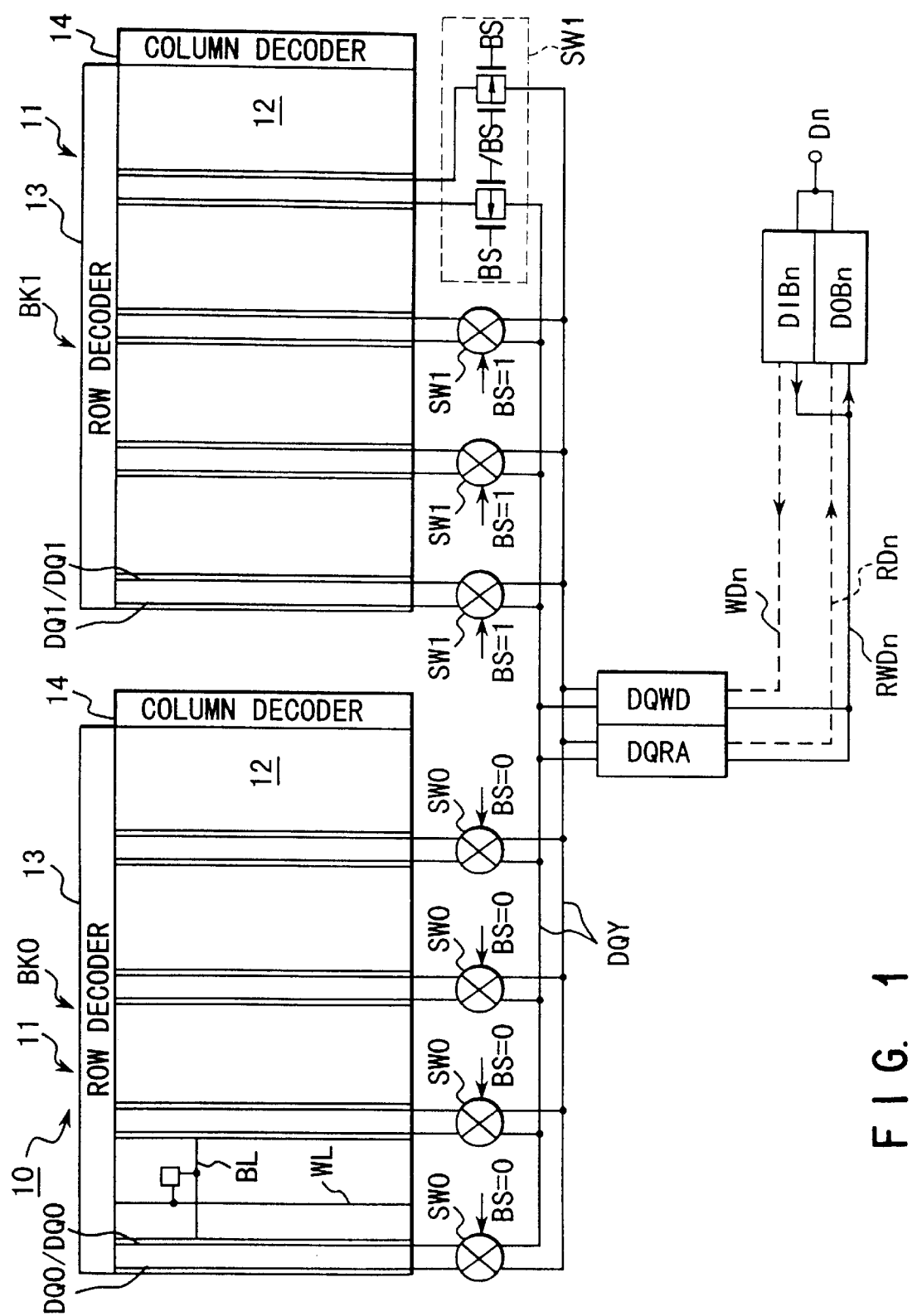
F I G. 1

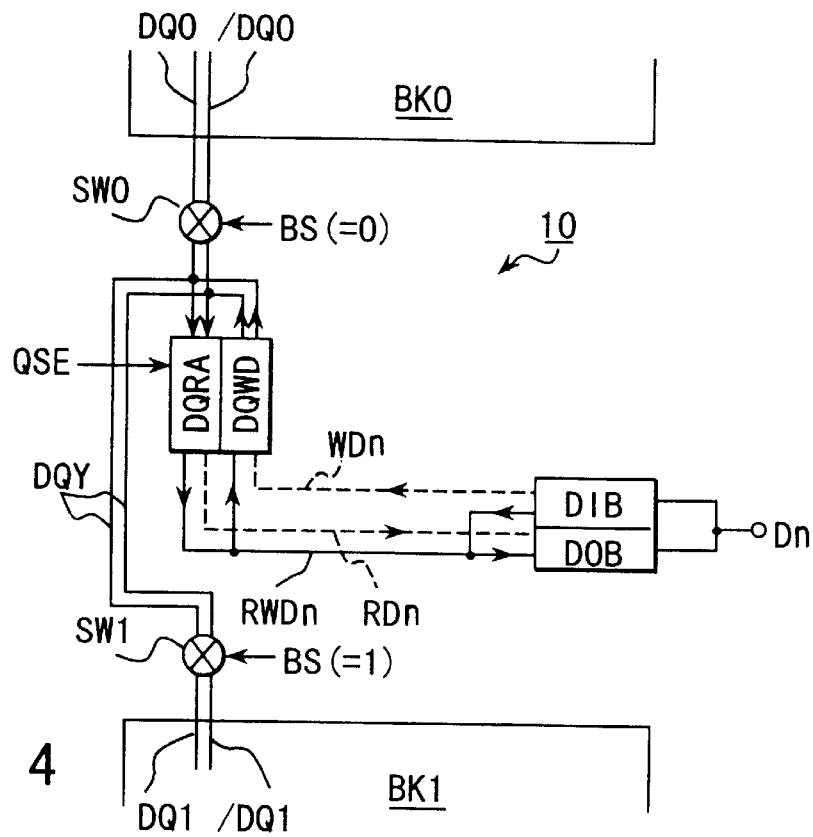
F I G. 4
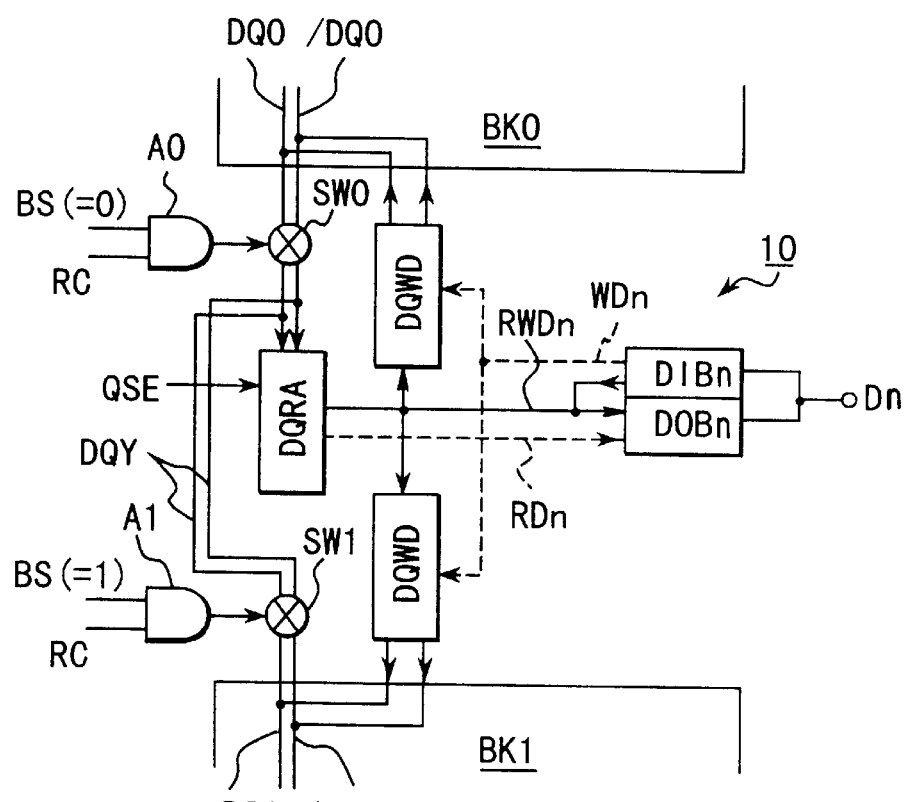
F I G. 5

SEMICONDUCTOR MEMORY DEVICE HAVING A PLURALITY OF BANKS

FIELD OF THE INVENTION

The present invention relates to a semiconductor memory device, and more specifically to a dynamic random access memory device ("DRAM") having a plurality of banks in which the data lines in each bank are selectively coupled through switch gates to common data lines.

BACKGROUND OF THE INVENTION

In recent years, the speed of microprocessors has greatly increased as compared with the speed of dynamic random access memories ("DRAMs"). Because DRAM is typically used as the main memory for a microprocessor, the difference between the microprocessor speed and the DRAM speed causes a serious problem in conventional computer systems known as the "memory bottleneck." Therefore, DRAMs having both high capacity and high speed operation are needed to overcome the memory bottleneck that occurs in conventional computer systems.

Synchronous operation is one of the measures that has been used to increase the speed of DRAMs. In a conventional synchronous dynamic random access memory ("SDRAM"), circuit operations are synchronized using a clock signal so that high-speed burst read/write operation can be performed. Additionally, in the conventional SDRAM, multiple independent memory banks are provided on one chip. Because it includes multiple memory banks, the SDRAM can lessen the delay when a "cache miss" occurs. In more detail, a cache miss occurs when the data requested by the microprocessor is not present in the cache (or high-speed) memory. When a cache miss occurs in a system using a conventional one-bank DRAM as the cache, data must be written from the main memory to the DRAM. Therefore, time is needed for precharging the bit lines in the one bank of the DRAM so a relatively long delay results. On the other hand, if an SDRAM having multiple banks is used as the cache memory, additional time for precharging bit lines is not needed. Furthermore, an SDRAM having multiple banks can perform a "bank interleave operation" in which data reading/writing is performed by alternating between different banks during a burst access. Thus, it is possible to continuously access memory cells at different row and column addresses.

FIGS. 8 and 9 show an example of a conventional semiconductor memory device having multiple memory banks (i.e., a multi-bank memory device). FIG. 9 shows a portion of FIG. 8 in greater detail. The bank interleave operation can be performed by the multi-bank memory device of FIGS. 8 and 9. For simplicity, the number of banks in the device is two, with a first bank BK0 being provided on the left side of a memory chip 10, and a second bank BK1 being provided on the right side. Each bank includes a memory cell array having word lines WL arranged in a vertical direction and bit lines BL arranged in a horizontal direction. The word lines WL are selected by a row decoder 13, and the bit lines BL are selected by a column decoder 14. Additionally, each memory cell array 11 is divided into sub-arrays 12 to decrease the capacitance of the bit lines.

As shown in FIG. 9, the bit lines BL and /BL in each sub-array 12 are selected by column select signals (for example, CSL(A) and CSL(A+1)). The selected bit lines BL and /BL are coupled to data lines DQ and /DQ that are arranged for each of the sub-arrays. During a read operation, signals on the data lines DQ and /DQ are amplified by a DQ read amplifier DQRA so as to transfer data to an input/output ("I/O") line RWDn (n=0 to 3) that is arranged in the vicinity of the memory cell array. During a write operation, data on an I/O line RWDn is transferred to data lines DQ and /DQ by a DQ write driving circuit DQWD. From the data lines DQ and /DQ, the data is transferred through the selected lines BL and /BL to the selected memory cell.

A read operation and a write operation are not executed at the same time or during the same clock period, and access to a memory cell in the first bank BK0 and access to a memory cell in the second bank BK1 are not simultaneously executed. Therefore, the DQ read amplifiers and DQ write driving circuits in different banks are not simultaneously operated, so the first and second banks can use the I/O lines RWD in common. As shown in FIG. 9, each I/O line RWDn is connected to a data input circuit DIBn and a data output circuit DOBn. The data input circuits DIB obtain external input data through pins D0 to D3, and the data output circuits DOB output data from the memory cells though pins D0 to D3. In the memory device of FIGS. 8 and 9, the input and output circuits are arranged at the center of the chip. FIG. 10 shows a memory device in which the input and output circuits are arranged along the side of the chip.

The bank interleave read operation in the device of FIGS. 8 and 9 will now be explained with reference to FIGS. 11 and 12. Only the relevant portion of the device of FIGS. 8 and 9 is shown in FIG. 11. In this example, a row address RA0 in the first bank BK0 is selected at clock period 0 and a column address CA0 in the first bank is selected as a head address for the burst read operation at clock period 1. The data stored in the memory cells connected to the word lines (i.e., rows) selected by the row address RA0 is amplified and stored on the corresponding bit lines. When a burst access command is received, the column address is incremented in synchronism with a clock signal, so that the column select lines CSL are activated in sequence beginning with the column selected by the head address. The head column select line CSL(A) is activated during clock period 1 to transfer the data on the corresponding bit lines to the data lines DQ and /DQ. The DQ read amplifier DQRA amplifies the data lines DQ and /DQ so as to output the data to the I/O line RWD. Then, during clock period 2, the next column select line CSL(A+1) is activated to output data to the I/O line RWD in the same manner.

While the column select lines (CSL(A) and CSL(A+1)) in the first bank are activated, a bank select signal BS0 (not shown) for selecting the first bank BK0 is in an active (e.g., "high") state, and the second bank BK1 memory cell array is completely precharged. Alternatively, a row address RB1 in the second bank BK1 is selected so that the data stored in the memory cells connected to the word lines selected by the row address RB1 is amplified and stored on the corresponding bit lines in the second bank. (This explanation assumes the latter case because it is more relevant to the present invention.)

Next, a column address CB1 in the second bank BK1 is selected as a head address for the second bank at clock period 3. The head column select line CSL(B) in the second bank is activated during clock period 3 and the bank select signal BS0 for the first bank goes into an inactive (e.g., low) state. As a result, the DQ read amplifiers DQRA and DQ write driving circuits DQWD in the first bank BK0 are disconnected from the I/O lines. At the same time, a bank select signal BS1 (not shown) for selecting the second bank BK1 goes into an active state so that the DQ read amplifiers DQRA and DQ write driving circuits DQWD in the second bank BK1 are connected to the I/O lines. Therefore, during clock period 3, the data on the bit lines corresponding to the head column select line CSL(B) is output to the I/O line RWD. Then, during clock period 4, the next column select line CSL(B+1) is activated to output data to the I/O line RWD in the same manner. In this manner, data output from the first bank BK0 is continuously interleaved with data output from the second bank BK1 during a bank interleave operation.

However, conventional semiconductor memory devices that support the bank interleave operation have the following drawbacks.

(1) The first and second banks BK0 and BK1 use the I/O lines RWD in common. However, for this reason, the I/O lines RWD extend along both the first and second banks so the length of the lines is relatively long. Because the DQ read amplifiers DQRA transmit full-swing signals (e.g., 0V to 5V) to the I/O lines RWD, the driving load of the DQ read amplifiers is significantly increased by the long I/O lines. As a result, it is difficult to access data at a high speed. The load on the DQ read amplifiers can be reduced by separating the I/O lines RWD into read-only lines and write-only lines. However, this doubles the number of I/O lines so the area occupied by the lines increases.

FIG. 13 shows a memory device that has been proposed to overcome the abovementioned drawback. In this device, the load of the I/O lines is reduced by dividing the common I/O line RWD into an I/O line RWD0 for the first bank BK0 and an I/O line RWD1 for the second bank BK1. Because of the division, the load of each of the partial I/O lines RWD0 and RWD1 is reduced to ½ the load of the common I/O line RWD. However, in this device, the partial I/O lines RWD0 and RWD1 must be selectively coupled to the data input circuit DIB and the data output circuit DOB. Therefore, multiplexer circuits MUX must be provided for selecting which partial I/O line to couple to the data input and data output circuits. The additional multiplexer circuits complicate the structure of the device and may increase the time required for accessing the data. Furthermore, if the data input circuits DIB and the data output circuits DOB are arranged along the side of the chip as shown in FIG. 10, the loads of the partial I/O lines RWD0 and RWD1 become unequal. Thus, the degree of freedom in the layout of the device is reduced.

(2) A separate set of DQ read amplifiers DQRA and DQ write driving circuits DQWD must be provided for each bank. Thus, as the number of banks is increased, the number of sets of DQ read amplifiers and write driving circuits is increased. Further, a separate set of DQ read amplifiers and write driving circuits must be provided for each sub-array in each bank. Therefore, as the memory cell array in each bank is divided into more sub-arrays, the number of sets of DQ read amplifiers and write driving circuits is increased. The memory device of FIGS. 8 and 9 has a two bank structure, and the memory cell array in each bank is divided into four sub-arrays. Each sub-array can input and output data, so a DQ read amplifier DQRA and a DQ write driving circuit DQWD are provided for each sub-array. Additionally, two pairs of data lines DQ and /DQ are provided for each sub-array, and in one cycle, two of the four sub-arrays in a bank are activated. Consequently, a large number of DQ read amplifiers and write driving circuits are needed, as shown by the following equation.

2(*DQRA* and *DQWD*)×2(pairs of *DQs*)×4(sub-arrays)×2(banks)=32 circuits

Additionally, control signals must be provided to the DQ read amplifiers and DQ write driving circuits in each bank. Thus, both the number of circuits and the number of control signal lines are increased with a multi-bank structure.

As described above, in conventional semiconductor memory devices having a multi-bank structure (e.g., SDRAMs), there exist drawbacks such as an increase in the number of circuits, an increase in the number of lines, and an increase in the load capacitance of the I/O lines. Accordingly, there is an decrease in the speed of the multi-bank device, and/or an increase in the area occupied by the lines.

SUMMARY OF THE INVENTION

In view of these problems, it is an object of the present invention to remove the above-mentioned drawbacks and to provide a high capacity and high speed semiconductor memory device.

Another object of the present invention is to provide a multi-bank semiconductor memory device in which an increase in the number of circuits, the number of lines, and the load capacitance of the I/O lines is reduced, so that chip area is decreased and the speed of the device is improved. To achieve this object, the data lines in each bank of the device are selectively coupled through switch gates to common data lines that are shared by the banks. The switch gates are operated in accordance with the bank select signals used to select the banks. A read amplifier is connected to the common data lines and shared by the banks. Thus, the bank interleave operation can be performed with a reduced number of circuits. Additionally, the line used to transmit the output of the read amplifier can be shortened to reduce the load on the read amplifier. Accordingly, chip area is decreased and the speed of the device is improved.

Yet another object of the present invention is to provide a multi-bank semiconductor memory device in which the driving load of the read amplifier is significantly reduced. To achieve this object, each bank is provided with data lines and global data lines that are perpendicular to the data lines. First switch gates selectively couple the data lines to the global data lines, and second switch gates selectively couple the global data lines of each bank to common data lines. The common data lines are formed between the banks, and the second switch gates are operated in accordance with the bank select signals used to select the banks. A read amplifier is connected to the common data lines and shared by the banks. Because of the addition of the global data lines, the common data lines, the read amplifier, and the like can be formed in an area between the banks. Therefore, the length of the common data lines and the line used to transmit the output of the read amplifier can be decreased to significantly reduce the load on the read amplifier.

According to a preferred embodiment of the present invention, a semiconductor memory device having a plurality of banks of memory cells is provided. The device has a data line provided in each of the banks for coupling to one of the memory cells in the corresponding bank. A common data line is shared by the banks, and is selectively coupled to one of the data lines through switches. An amplifier is coupled to the common data line to amplify data read from a selected memory cell, and an I/O line is coupled to the amplifier to transmit the amplified data to an outer section. In the preferred embodiment, one of the banks of the memory device is selected by a bank select signal.

According to another embodiment of the present invention, a semiconductor memory device having first and second banks of memory cells is provided. The device has a first data line for each of the first and second banks for coupling to memory cells in the corresponding bank. A second data line is also provided for each of the first and second banks, and is arranged perpendicular to the first data line. First switches selectively couple the first data lines to the second data lines. A second switch selectively couples the second data line of the first bank to a common data line in accordance with a bank select signal, and a third switch selectively couples the second data line of the second bank to the common data line in accordance with the bank select signal. Additionally, an amplifier is coupled to the common data line to amplify data read from one of the memory cells, and an I/O line is coupled to the amplifier to transmit the amplified data to an outer section. In the device, the bank select signal is used to select either the first or second bank of memory cells.

Other objects, features, and advantages of the present invention will become apparent from the following detailed description. It should be understood, however, that the detailed description and specific examples, while indicating preferred embodiments of the invention, are given by way of illustration only and various modifications may naturally be performed without deviating from the scope of the present invention.

BRIEF DESCRIPTION OF THE DRAWINGS

FIG. 1 is a block diagram showing a first embodiment of a semiconductor memory device according to the present invention;

FIG. 4 is a block diagram showing a second embodiment of a semiconductor memory device according to the present invention;

FIG. 5 is a block diagram showing a third embodiment of a semiconductor memory device according to the present invention;

DETAILED DESCRIPTION OF PREFERRED EMBODIMENTS

Preferred embodiments of the present invention will be described in detail hereinbelow with reference to the attached drawings.

Figure 2:
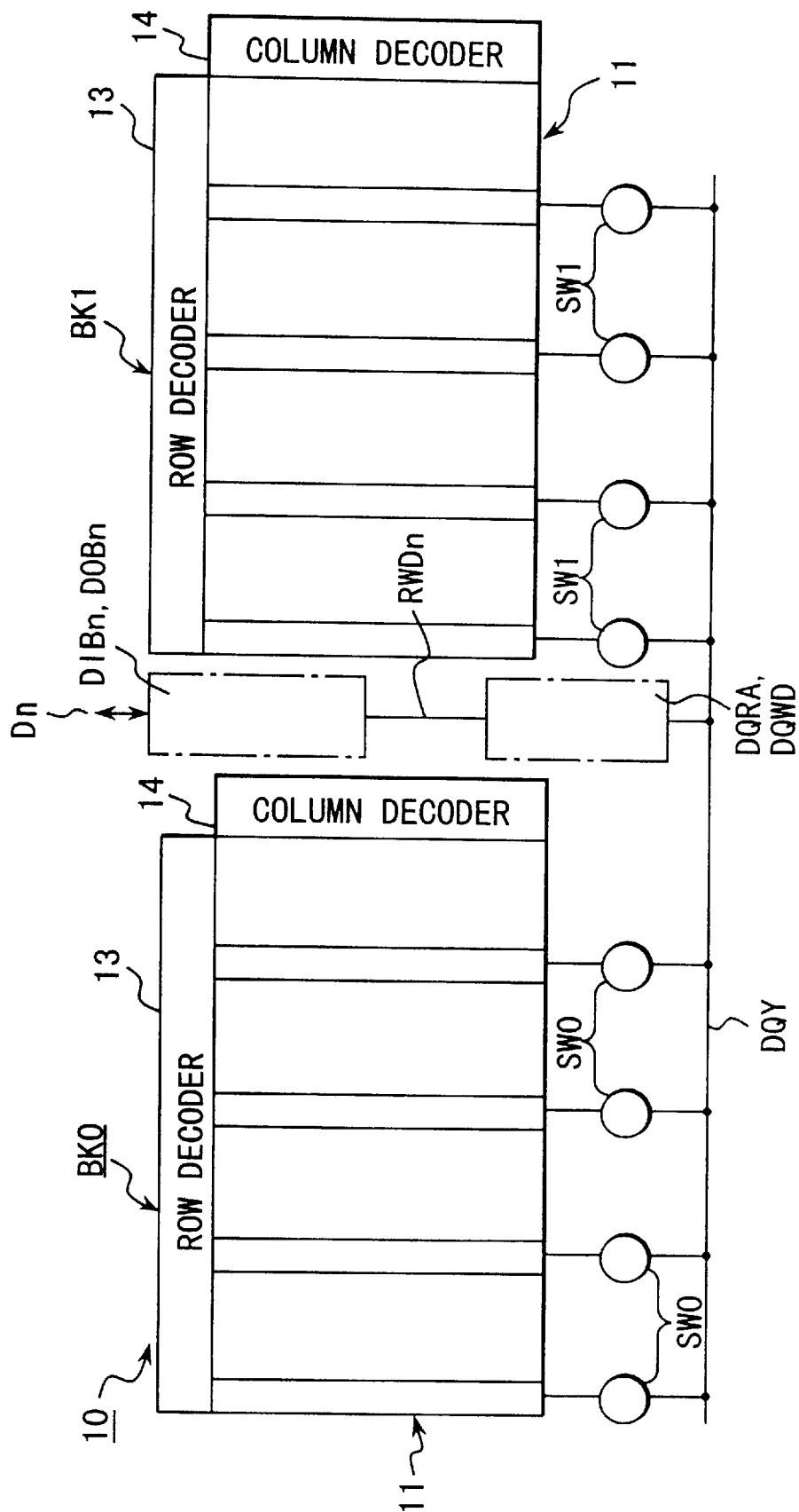
FIG. 2 is a structural view showing a layout for the device of FIG. 1.
Figure 8:
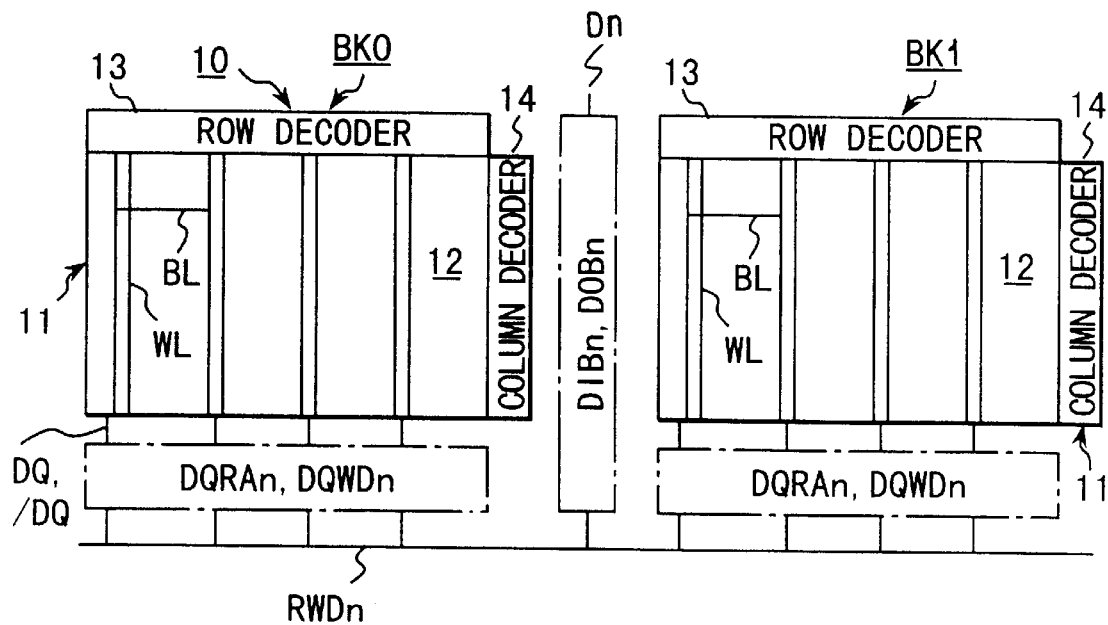
FIG. 8 is a structural view showing a layout for a conventional semiconductor memory device.
Figure 9:
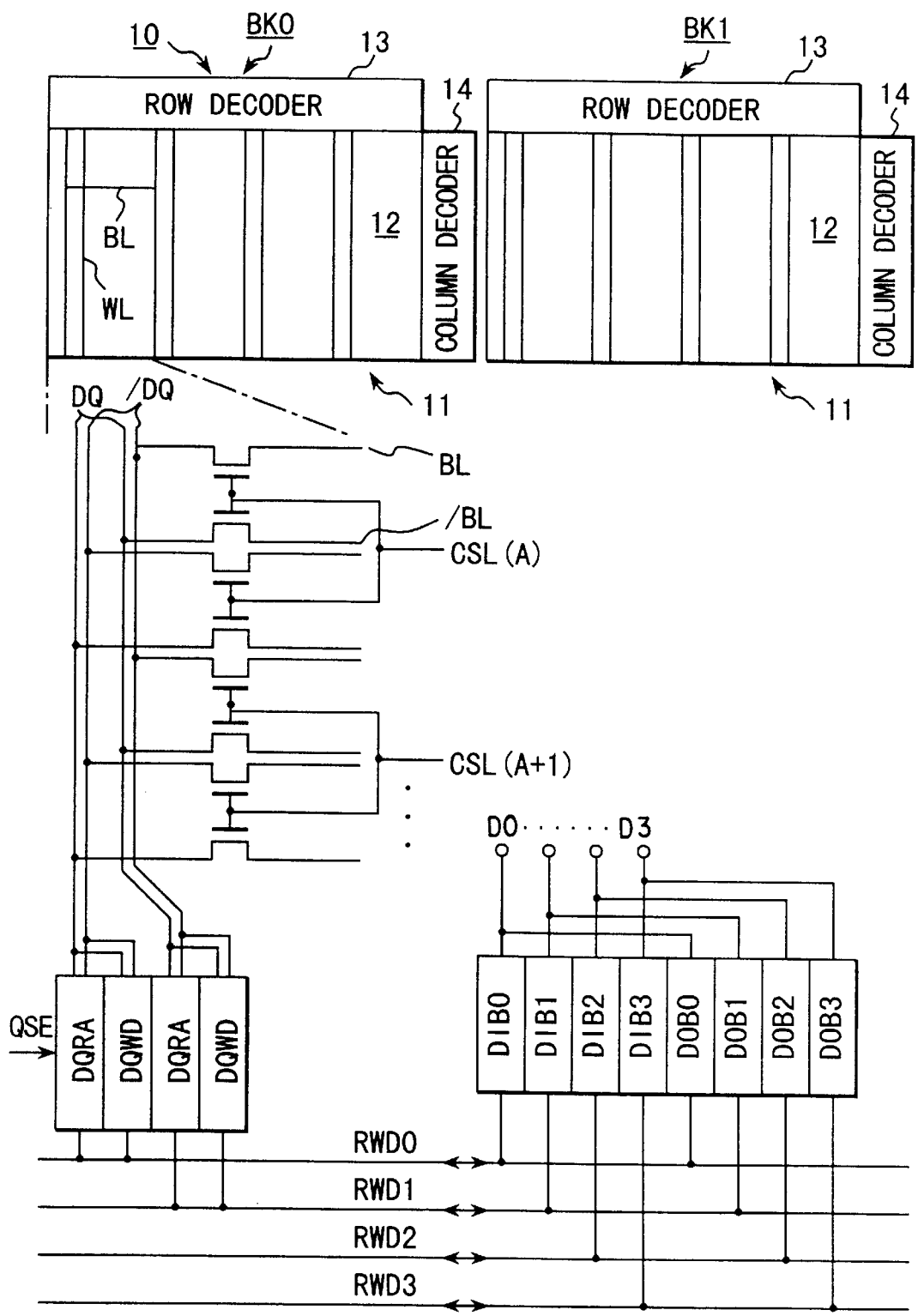
FIG. 9 is a block diagram showing detail of the device of FIG. 8.
Figure 10:
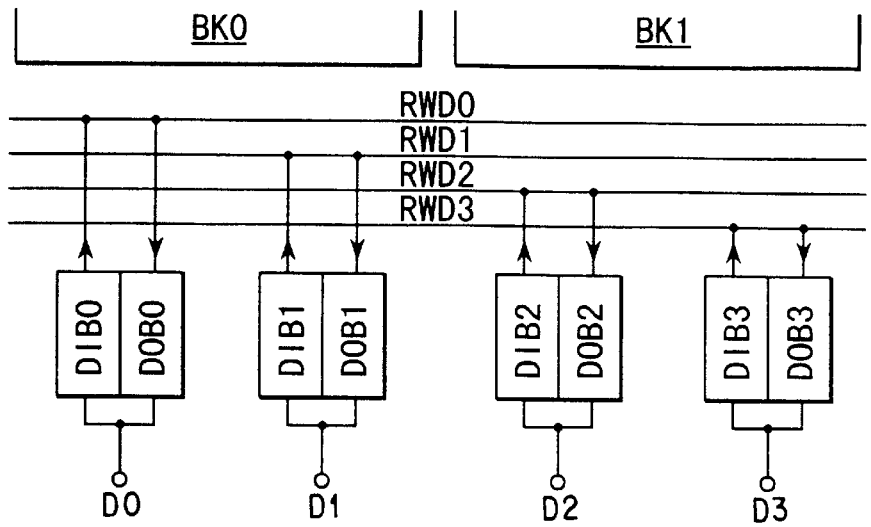
FIG. 10 is a block diagram showing another layout for the conventional semiconductor memory device.
Figure 11:
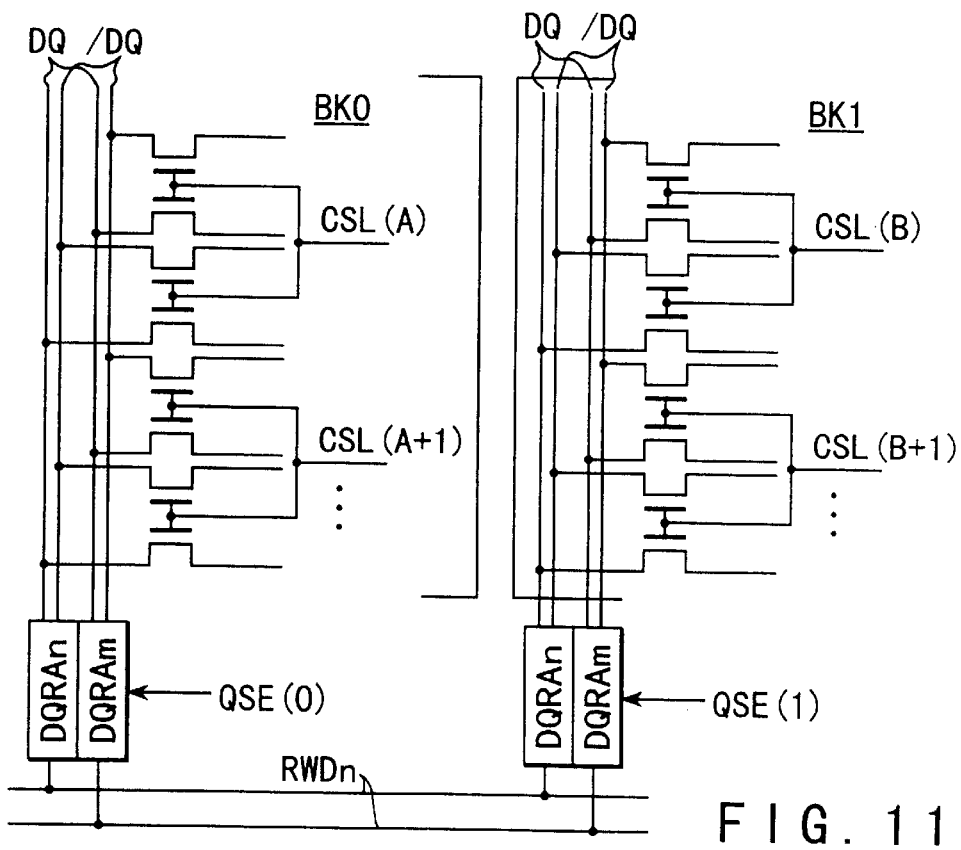
FIG. 11 is a block diagram showing detail of a portion of the device of FIGS. 8 and 9.
Figure 12:
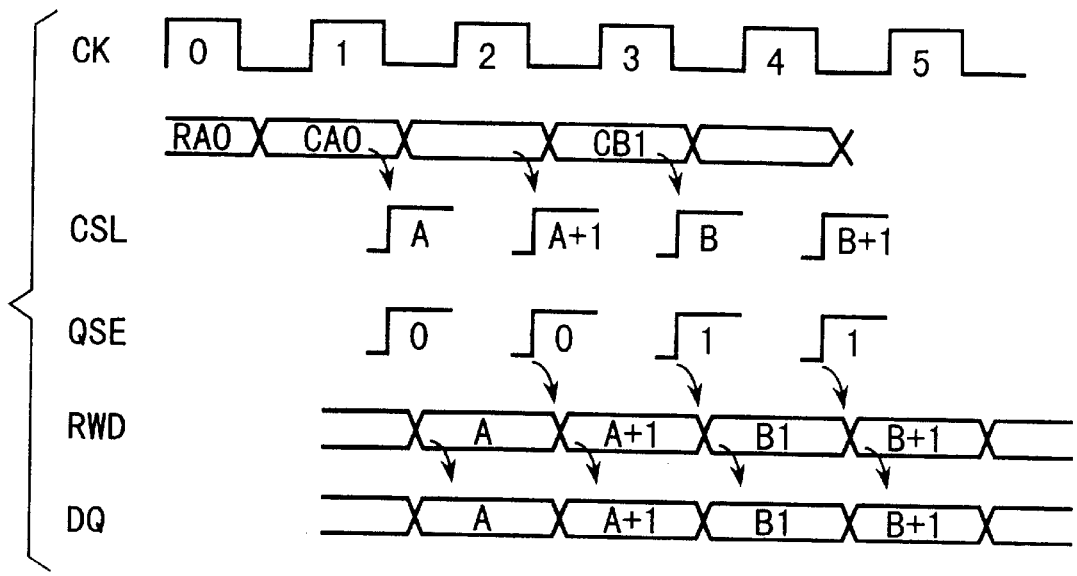
FIG. 12 is a timing chart explaining the operation of the device of FIGS. 8 and 9.
Figure 13:
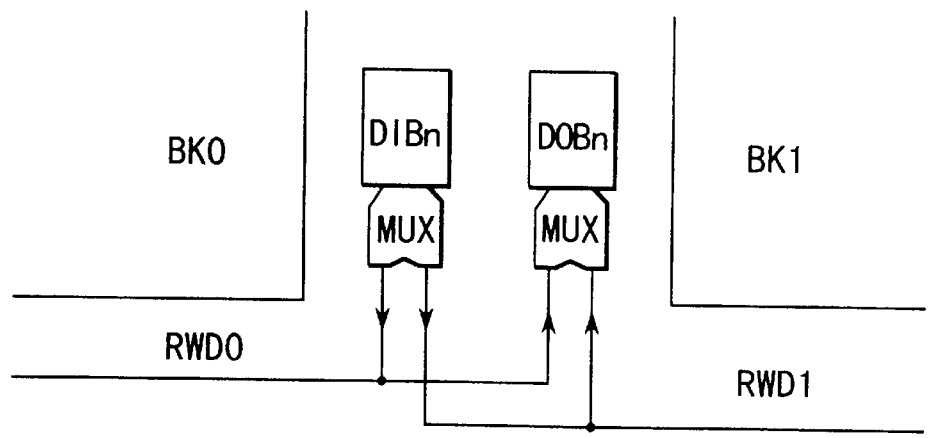
FIG. 13 is a block diagram showing another conventional semiconductor memory device.

FIG. 1 shows the circuit structure of a semiconductor memory device according to a first embodiment of the present invention, and FIG. 2 shows a schematic layout for the device of FIG. 1. In FIGS. 1 and 2, elements that are the same as elements in FIGS. 8 and 9 are represented by the same reference numerals and discussion thereof is omitted. In the first embodiment, a memory chip 10 includes a first bank BK0 and a second bank BK1 arranged in the direction of the bit lines BL. In each bank, the memory cell array is divided into four sub-arrays 12, and data lines DQ and /DQ are provided for each sub-array. In particular, data lines DQ0 and /DQ0 are provided for the first bank BK0, and data lines DQ1 and /DQ1 are provided for the second bank BK1.

The data lines DQ0 and /DQ0 of the first bank BK0 are selectively coupled to common data lines DQY through first switch gates SW0. The first switch gates SW0 are activated in accordance with a bank select signal BS (e.g., when BS="0"). The data lines DQ1 and /DQ1 of the second bank BK1 are selectively coupled to the common data lines DQY through second switch gates SW1. The second switch gates SW1 are also activated in accordance with a bank select signal BS (e.g., when BS="1"). In preferred embodiments, each of the first and second switch gates SW0 and SW1 is formed by a pair of two transistor transmission gates, as shown in FIG. 1. The first and second switch gates SW0 and SW1 are complimentarily operated in accordance with a common bank select signal BS so that the data lines DQ0 and /DQ0 of the first bank BK0 and the data lines DQ1 and /DQ1 of the second bank BK1 are not coupled to the common data lines DQY at the same time. In further embodiments, other types of switch gates (e.g., one transistor transmission gates) and/or separate bank select signals are used.

The common data lines DQY are connected to a DQ read amplifier DQRA and a DQ write driving circuit DQWD, which are commonly connected to a data input circuit DIBn and a data output circuit DOBn through an I/O line RWDn. The input and output circuits DIBn and DOBn are connected to a pin Dn of the memory chip. In the first embodiment, the DQ read amplifier DQRA, the DQ write driving circuit DQWD, the I/O line RWDn, and the data input and output circuits DIBn DOBn are preferably arranged between the first and second banks, as shown in the layout of FIG. 2.

The operation of the memory device shown in FIGS. 1 and 2 will now be explained. For a read operation, data is read from a selected memory cell and supplied to the DQ read amplifier DQRA through the bit lines BL, the data lines DQ and /DQ, and the common data lines DQY. The DQ read amplifier amplifies the signals on the common data lines so as to output the data from the selected memory cell to the I/O line RWDn. From the I/O line, the data is supplied to the pin Dn through the data output circuit DOBn. Similarly, for a write operation, the data input circuit DIBn transfers data from the pin Dn to the I/O line RWDn. The data on the I/O line is transferred to the common data lines DQY by the DQ write driving circuit DQWD. From the common data lines, the data is written to a selected memory cell through the data lines DQ and /DQ and the bit lines BL.

During read and write operations, the common data lines DQY are coupled to the data lines DQ0 and /DQ0 in the first bank BK0 when the first switch gates SW0 are activated, and to the data lines DQ1 and /DQ1 in the second bank BK1 when the second switch gates SW1 are activated. Because the first and second switch gates are complimentarily operated (e.g., in accordance with a common bank select signal BS), the DQ read amplifier and the DQ write driving circuit can be shared by the first and second banks. Additionally, the bank interleave operation can be performed in the device by controlling the bank select signal to alternately select the banks.

Figure 3A:
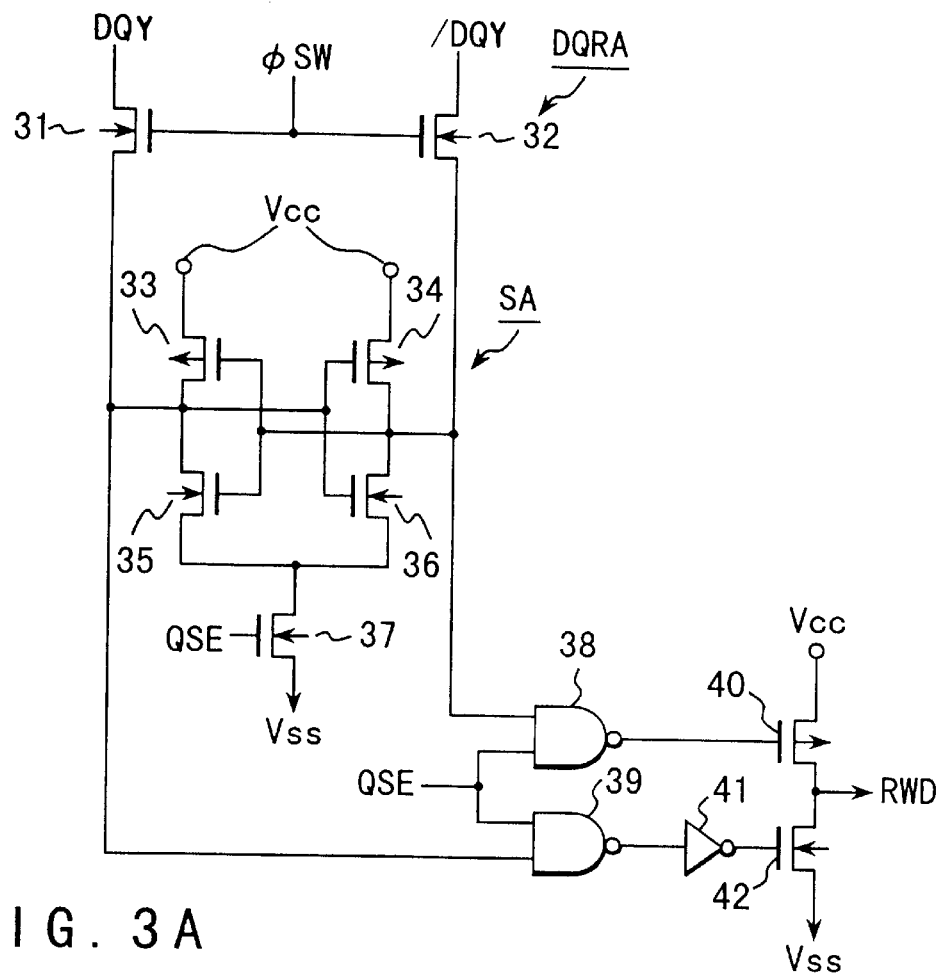
FIG. 3A is a circuit diagram showing detail of the DQ read amplifier of FIG. 1.

FIG. 3A is a circuit diagram showing a preferred embodiment of the DQ read amplifier of the first embodiment of the present invention. As shown, two N-channel transistors 31 and 32 selectively couple a sense amplifier SA to the common data lines DQY and /DQY in accordance with a signal ΦSW. The sense amplifier SA includes two P-channel transistors 33 and 34 and three N-channel transistors 35, 36, and 37. The sense amplifier is driven by a DQ sense enable signal QSE that is supplied to the gate of the third N-channel transistor 37. The output signals of the sense amplifier SA are supplied along with the DQ sense enable signal QSE to two NAND circuits 38 and 39, as shown in FIG. 3A. The output of one of the NAND circuits 38 is supplied to the gate of a P-channel transistor 40, and the output of the other NAND circuit 39 is supplied through an inverter 41 to the gate of an N-channel transistor 42. The P-channel transistor 40 and the N-channel transistor 42 are serially connected between a power source and ground to form an inverter, and the I/O line RWD is connected to the serial connection point of the transistors.

Figure 3B:
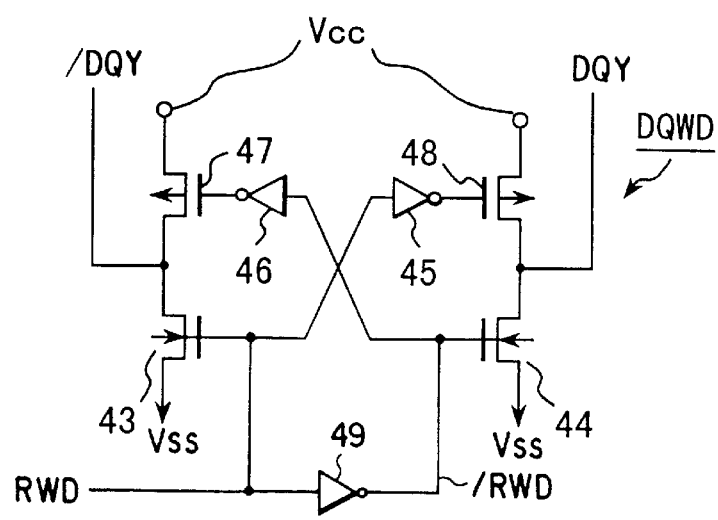
FIG. 3B is a circuit diagram showing detail of the DQ write driving circuit of FIG. 1.

FIG. 3B is a circuit diagram showing a preferred embodiment of the DQ write driving circuit of the first embodiment of the present invention. As shown, the I/O line RWD is connected to the gate of a first N-channel transistor 43 and the input terminal of a first inverter 45. The I/O line signal RWD is supplied through a third inverter 49 to the gate of a second N-channel transistor 44 and the input terminal of a second inverter 46. The output terminals of the inverters 45 and 46 are respectively connected to the gates of first and second P-channel transistors 47 and 48. Both the first P-channel and N-channel transistors 47 and 43, and the second P-channel and N-channel transistors 48 and 44 are serially connected between the power source and ground. The common data lines DQY and /DQY are respectively connected to the serial connection points of the second and first transistors, as shown in FIG. 3B.

In the memory device of the first embodiment of the present invention, the first and second switch gates are complimentarily operated in accordance with a common bank select signal, and a pair of common data lines is connected to both the first and second switch gates. The pair of common data lines allows the DQ read amplifier and the DQ write driving circuit to be shared by the first and second banks. Thus, the number of sets of DQ read amplifiers and write driving circuits is reduced to be the same as the number of pairs of data lines (DQ and /DQ) in each sub-array. Because each of the DQ read amplifiers and write driving circuits includes many transistors while the added switch gates are each preferably formed by only one or two transistors, the chip area is significantly reduced in the first embodiment.

Furthermore, the I/O line must connect each of the DQ read amplifiers and write driving circuits to the data input and output circuits. Because the DQ read amplifier and write driving circuit are shared by both banks in the first embodiment, the DQ read amplifier and write driving circuit and the data input and output circuits can be arranged so that the I/O line is shorter than in the conventional device. Thus, the driving load of the DQ read amplifier is reduced to allow the DQ read amplifier to transmit its fill-swing output signal at a high speed. Also, although the common data lines extend the length of both the first and second banks, the DQ read amplifier can begin its operation as soon as there is a minute potential difference between the common data lines. Therefore, the speed of the device does not deteriorate due to the load of the common data lines. Accordingly, the first embodiment of the present invention provides a multi-bank memory device in which chip area is decreased and the speed of the device is improved.

FIG. 4 shows a second embodiment of the memory device of the present invention. In FIG. 4, elements that are the same as elements in FIGS. 1 and 2 are represented by the same reference numerals and discussion thereof is omitted. In the first embodiment, the first and second banks BK0 and BK1 are arranged in the direction of the bit lines. In the second embodiment, the first and second banks BK0 and BK1 are arranged in the direction of the word lines. The first and second switch gates SW0 and SW1, the common data lines DQY, the DQ read amplifier DQRA, the DQ write driving circuit DQWD, the I/O line RWDn, the data input circuit DIBn, and the data output circuit DOBn are preferably arranged between the banks BK0 and BK1. The second embodiment of the present invention provides the same advantages as the first embodiment. However, in the second embodiment, the common data lines DQY and the I/O line RWDn can be shortened as compared with the first embodiment. Therefore, the data access speed and chip area can be further improved.

FIG. 5 shows a third embodiment of the memory device of the present invention. In FIG. 5, elements that are the same as elements in the first and second embodiments are represented by the same reference numerals and discussion thereof is omitted. In the third embodiment, a DQ read amplifier DQRA is shared by the first and second banks BK0 and BK1, but a separate DQ write driving circuit DQWD is provided for each of the banks. Thus, only the DQ read amplifier DQRA is connected to the common data lines DQY. A first DQ write driving circuit DQWD0 is connected between the I/O line RWDn and the data lines DQ0 and /DQ0 of the first bank BK0, and a second write driving circuit DQWD1 is connected between the I/O line RWDn and the data lines DQ1 and /DQ1 of the second bank BK1. Consequently, the number of DQ write driving circuits is the same as in the conventional device. However, because the first and second switch gates SW0 and SW1 are not used during a write operation, the equivalent resistance component of the switch gate is not provided in the data path. Therefore, data can be written in the device of the third embodiment at a higher speed.

More specifically, the bank select signal BS and a read signal RC, which is generated during a read operation, are illustratively supplied to two AND gates A0 and A1. The output of one of the AND gates A0 is supplied to the first switch gate SW0, and the output of the other AND gate A1 is supplied to the second switch gate SW1. Thus, the first and second switch gates SW0 and SW1 are activated only when the level of the read signal RC is "high". As a result, the common data lines DQY are used only when data is read. Because the common data lines DQY are not connected to the data lines DQ and /DQ during a write operation, the load is reduced.

Figure 6:
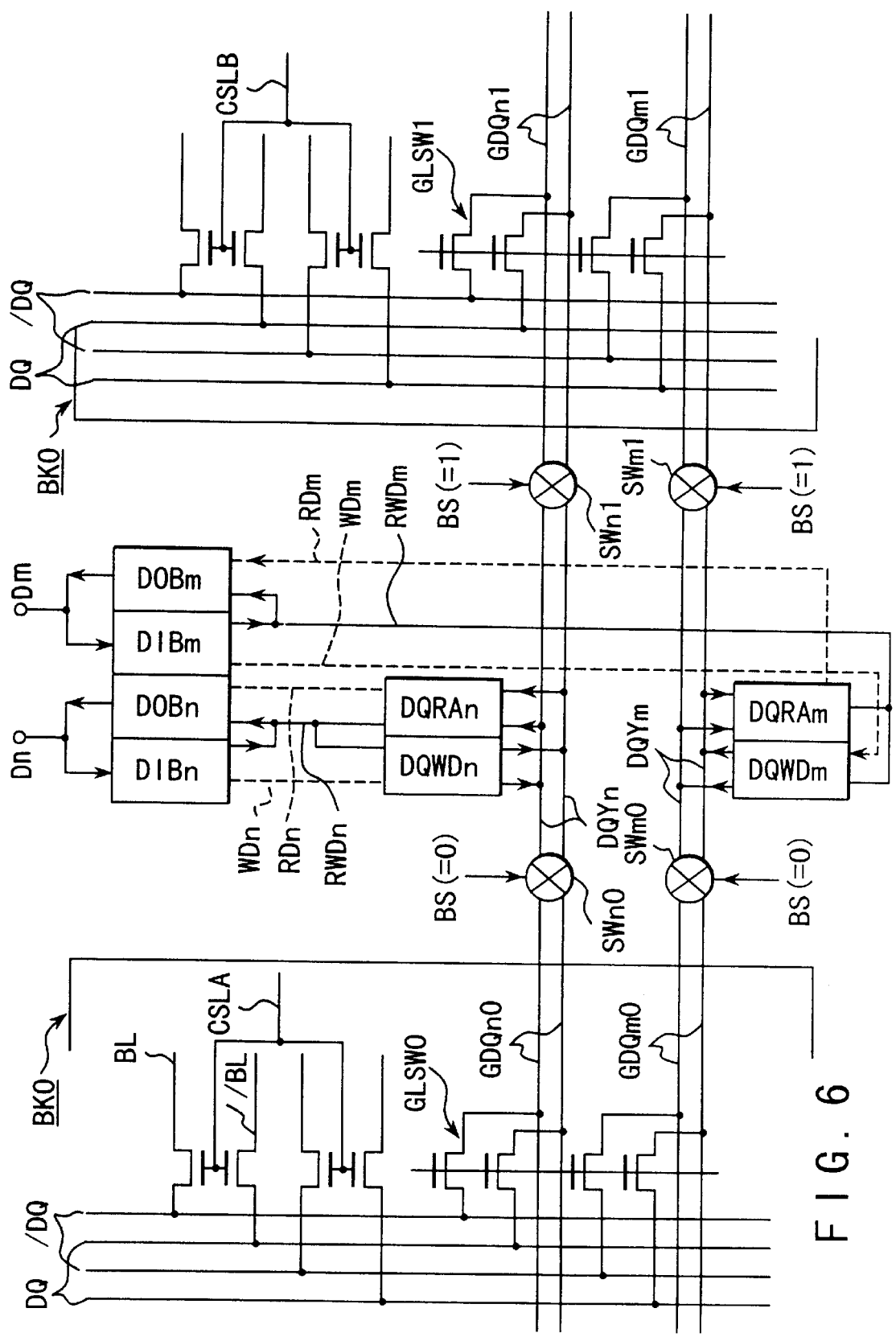
FIG. 6 is a block diagram showing a fourth embodiment of a semiconductor memory device according to the present invention.

FIG. 6 shows a fourth embodiment of the memory device of the present invention. In FIG. 6, elements that are the same as elements in the first through third embodiments are represented by the same reference numerals and discussion thereof is omitted. In the embodiments described above, the common data lines were coupled through the switch gates to the data lines DQ and /DQ in each of the sub-arrays. In the fourth embodiment, global data lines GDQ are arranged in each bank, and are coupled to the data lines DQ and /DQ through global switch gates GLSW. The common data lines DQY are coupled to the global data lines in each bank through first and second switch gates SW.

More specifically, the first and second banks BK0 and BK1 are arranged in the direction of the bit lines BL. In the first bank BK0, global data lines GDQm0 and GDQn0 are arranged perpendicular to the data lines DQ and /DQ, and are coupled to the data lines DQ and /DQ in each sub-array through global switch gates GLSW0. (For example, global data line pair GDQn0 is coupled to one of the data line pairs DQ and /DQ in each of the sub-arrays in the first bank BK0.) Similarly, in the second bank BK1, global data lines GDQm1 and GDQn1 are arranged perpendicular to the data lines DQ and /DQ, and are coupled to the data lines DQ and /DQ in each sub-array through global switch gates GLSW1. The global data lines GDQm0 and GDQn0 of the first bank are connected to first switch gates SWm0 and SWn0, and the global data lines GDQm1 and GDQn1 of the second bank are connected to second switch gates SWm1 and SWn1. First common data lines DQYm are connected to one of the first switch gates SWm0 and one of the second switch gates SWm1, and second common data lines DQYn are connected the other first switch gate SWN0 and the other second switch gate SWn1.

Additionally, a first DQ read amplifier DQRAm and a first DQ write driving circuit DQWDm are connected to the first common data line DQYm. A first data input circuit DIBm and a first data output circuit DOBm are connected to the first DQ read amplifier and write driving circuit through a first I/O line RWDm. The first data input and output circuits are connected to a first pin Dm. Similarly, a second DQ read amplifier DQRAn and a second DQ write driving circuit DQWDn are connected to the second common data line DQYn. A second data input circuit DIBn and a second data output circuit DOBn are connected to the second DQ read amplifier and write driving circuit through a second I/O line RWDn. The first data input and output circuits are connected to a second pin Dn. As in the first through third embodiments, the first switch gates SWm0 and SWn0 and the second switch gates SWm1 and SWn1 are complimentarily operated in accordance with the bank select signal BS.

In the memory device of the fourth embodiment, the first and second banks are arranged in the direction of the bit lines, the data lines of each bank are coupled to global data lines through switch gates, and the global data lines are coupled to the common data lines through switch gates. The DQ read amplifiers, the DQ write driving circuits, the data input circuits, and the data output circuits are preferably arranged between the first and second memory banks. Therefore, the I/O lines can be shortened to decrease the load on the DQ read amplifiers. Further, the data lines (DQ and /DQ) are preferably arranged so that they do not extend outside of the memory cell array. This allows a decrease in the length of the data lines, and thus the load of the data lines is reduced. Therefore, data is transferred from the bit lines to the data lines more quickly so that data access speed is further improved.

Figure 7:
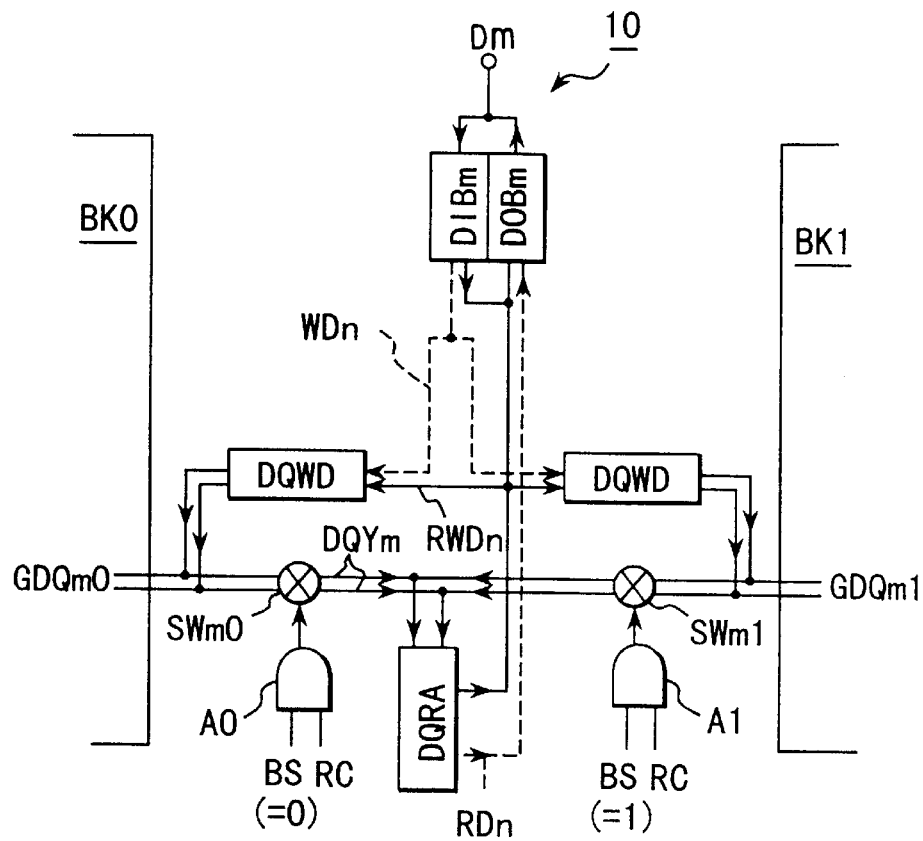
FIG. 7 is a block diagram showing a fifth embodiment of a semiconductor memory device according to the present invention.

FIG. 7 shows a fifth embodiment of the memory device of the present invention. In FIG. 7, elements that are the same as elements in the first through fourth embodiments are represented by the same reference numerals and discussion thereof is omitted. Like the fourth embodiment, the fifth embodiment of the present invention includes global data lines GDQ and has its DQ read amplifiers DQRA shared by the first and second banks BK0 and BK1. However, in the fifth embodiment, separate DQ write driving circuits DQWD are provided for each of the banks. Thus, just as in the third embodiment (FIG. 5), the fifth embodiment has a reduced load during a write operation.

Accordingly, preferred embodiments of the present invention include switch gates operated on the basis of a bank select signal and common data lines connected to the switch gates. With this structure, a DQ read amplifier and an I/O line can be shared by multiple banks, so that separate DQ read amplifiers and I/O lines are not required in each of the banks. Therefore, the required number of DQ read amplifiers is reduced so that the chip area of the memory device is decreased. Further, in some embodiments of the present invention, the DQ write driving circuits are also shared by multiple banks to further decrease the required chip area. More specifically, the number of DQ read amplifiers and write driving circuits required in each of the above-described embodiments of the present invention can be calculated as follows. (For the following explanation, the number of the data lines DQ and sub-arrays in the memory devices of the present invention are assumed to be the same as in the conventional device of FIGS. 8 and 9.)

In the first embodiment, the number of DQ read amplifiers and write driving circuits is reduced to four, as shown by the following equation.

$$2(DQRA \text{ and } DQWD) \times 2(\text{pairs of } DQs) \times 1(\text{sub-arrays share}) \times 1(\text{banks share}) = 4$$

In the memory device of the second embodiment (FIG. 4), the required number of DQ read amplifiers and write driving circuits is half of the number required in the conventional device (i.e., 16 circuits), as shown by the following equation.

$$2(DQRA \text{ and } DQWD) \times 2(\text{pairs of } DQs) \times 4(\text{sub-arrays}) \times 1(\text{banks share}) = 16$$

In the memory device of the third embodiment (FIG. 5), the banks do not share the DQ write driving circuits so 24 circuits are required, as shown by the following equation.

$$[1(DQRA) \times 2(\text{pairs of } DQs) \times 4(\text{sub-arrays}) \times 1(\text{banks share})] + [1(DQWD) \times 2(\text{pairs of } DQs) \times 4(\text{sub-arrays}) \times 2(\text{banks})] = 24$$

In the memory device of the fourth embodiment (FIG. 6), the global data lines are provided so only four circuits are required, as shown by the following equation.

$$2(DQRA \text{ and } DQWD) \times 2(\text{pairs of } DQs/GDQs) \times 1(\text{sub-arrays share}) \times 1(\text{banks share}) = 4$$

In the memory device of the fifth embodiment (FIG. 7), the global data lines are provided but the DQ write driving circuits are not shared by the banks. Thus, six circuits are required, as shown by the following equation.

$$[1(DQRA) \times 2(\text{pairs of } DQs/GDQs) \times 1(\text{sub-arrays share}) \times 1(\text{bank share})] + [1(DQWD) \times 2(\text{pairs of } DQs/GDQs) \times 1(\text{sub-arrays share}) \times 2(\text{banks})] = 6$$

Thus, in the above-described embodiments, the total number of DQ read amplifiers and DQ write driving circuits is reduced as compared with the conventional device. Additionally, the provision of the global data lines in the fourth and fifth embodiments (FIGS. 6 and 7) allows the number of DQ read amplifiers and DQ write driving circuits to be further reduced.

In the embodiments described above, the I/O line RWD is connected to both the DQ read amplifier and the DQ write driving circuit. However, in further embodiments, the I/O line RWD is divided into a read-only line RD and a write-only line WD, as shown by the broken lines in FIGS. 1 and 4–7. In such embodiments, data read from the selected memory cell is supplied from the DQ read amplifier DQRA to the data output circuit DOB through the read-only I/O line RD. Similarly, data to be written to the selected memory cell is supplied from the data input circuit DIB to the DQ write driving circuit DQWD through the write-only I/O line WD. Because of the division, the load of each of the I/O lines is reduced as compared with the shared I/O line embodiments. Thus, the speed of the device is further increased. Additionally, although the number of lines is greater than in the shared I/O line embodiments, the reduction in the number of DQ read amplifiers and write driving circuits still results in a reduction in chip area as compared with the conventional circuit.

While there has been illustrated and described what are presently considered to be the preferred embodiments of the present invention, it will be understood by those in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claim is:

1. A semiconductor memory device comprising:
    a plurality of banks of memory cells;
    data lines, a data line provided in each of the banks, at least one of the data lines being selectively coupled to a selected memory cell;
    a common data line shared by at least two of the banks;
    a plurality of switches, each of the switches selectively coupling one of the data lines to the common data line;
    an amplifier for amplifying data read from the selected memory cell, the amplifier being coupled to the common data line; and
    an I/O line coupled to the amplifier for transmitting the amplified data to an outer section, wherein one of the banks of memory cells is selected by a bank select signal.

2. The memory device as defined in claim 1, wherein each of the banks includes a plurality of sub-arrays, and at least one of the data lines is provided for each of the sub-arrays.

3. The memory device as defined in claim 1, further comprising a write circuit coupled to the common data line and the I/O line, for transferring data from the I/O line to the common data line.

4. The memory device as defined in claim 1, further comprising a plurality of write circuits, each of the write circuits being connected between one of the data lines and the I/O line for transferring data from the I/O line to the one data line.

5. The memory device as defined in claim 1, wherein bit lines are connected to the memory cells, the banks are arranged in a direction of the bit lines, and the common data line extends along each of the banks.

6. The memory device as defined in claim 1, wherein word lines are connected to the memory cells, the banks are arranged in a direction of the word lines, and the common data line is arranged between the banks.

7. The memory device as defined in claim 6, further comprising data input and output circuits coupled to the I/O line.

8. A semiconductor memory device, comprising:
    first and second banks, each of the banks including a plurality of memory cells;
    first data lines, at least one first data line provided for each of the first and second banks, the first data line being selectively coupled to memory cells in the corresponding bank;
    second data lines, at least one second data line provided for each of the first and second banks, the second data lines being arranged perpendicular to the first data lines;
    first switches, at least one first switch provided for each of the first and second banks, each of the first switches selectively coupling one of the first data lines to one of the second data lines;
    at least one common data line arranged between the first and second banks, the common data line being shared by the first and second banks;
    a second switch for selectively coupling the second data line of the first bank to the common data line in accordance with a bank select signal;
    a third switch for selectively coupling the second data line of the second bank to the common data line in accordance with the bank select signal;
    an amplifier coupled to the common data line, for amplifying data read from one of the memory cells; and
    an I/O line coupled to the amplifier for transmitting the amplified data to an outer section, wherein the bank select signal is used to select either the first or second bank.

9. The memory device as defined in claim 8, wherein each of the banks includes a plurality of sub-arrays, and at least one first data line is provided for each of the sub-arrays.

10. The memory device as defined in claim 8, further comprising a write circuit coupled to the common data line and the I/O line, for writing input data to one of the memory cells.

11. The memory device as defined in claim 8, further comprising a plurality of write circuits, each of the write circuits being coupled to one of the second data lines and the I/O line, for writing input data to one of the memory cells.

12. The memory device as defined in claim 11, further comprising data input and output circuits coupled to the I/O line.

13. The memory device as defined in claim 8, wherein the amplifier is connected to an output I/O line, and the write circuit is connected to a separate input I/O line.

14. A semiconductor memory device comprising:
    first and second banks, each of the banks including a plurality of memory cells and bit lines connected to the memory cells, one of the banks being selected by a bank select signal;
    data lines, at least one data line provided for each of the banks, the data lines being arranged perpendicular to a direction of the bit lines, the first and second banks being separated from each other in a direction of the data lines;
    a common data line arranged between the first and second banks, the common data line being shared by the first and second banks;
    a first switch connected between the data line of the first bank and the common data line, the first switch selectively coupling the data line of the first bank to the common data in accordance with the bank select signal;
    a second switch connected between the data line of the second bank and the common data line, the second switch selectively coupling the data line of the second bank to the common data line in accordance with the bank select signal;

an amplifier arranged between and shared by the first and second banks, the amplifier being coupled to the common data line to amplify data read from one of the memory cells; and an I/O line arranged between the first and second banks, the I/O line being coupled to the amplifier for transmitting amplified data to an outer section.

15. The memory device as defined in claim 14, wherein each of the first and second banks includes a plurality of sub-arrays, and at least one data line is formed in each of the sub-arrays.

16. The memory device as defined in claim 14, further comprising a write circuit coupled to the common data line and the I/O line for transmitting data from the I/O line to the common data line, the write circuit being shared by the first and second banks.

17. The memory device as defined in claim 14, further comprising:

a first write circuit coupled to the data line of the first bank and the I/O line, for transmitting data from the I/O line to the data line of the first bank; and a second write circuit coupled to the data line of the second bank and the I/O line, for transmitting data from the I/O line to the data line of the second bank.

18. The memory device as defined in claim 17, further comprising data input and output circuits coupled to the I/O line.

19. The memory device as defined in claim 14, further comprising:

a first logic circuit coupled to the first switch, for controlling the first switch in accordance with the bank select signal and a data read signal; and a second logic circuit coupled to the second switch, for controlling the second switch in accordance with the data read signal and an inverse signal of the bank select signal.

20. A semiconductor memory device comprising:

first and second banks, each of the banks including a plurality of memory cells, one of the first and second banks being selected by a bank select signal;

at least one first data line provided for the first bank to be coupled to a selected memory cell in the first bank;

at least one second data line provided for the first bank, the second data line being arranged perpendicular to the first data line;

at least one first switch for selectively coupling the first data line to the second data line;

at least one third data line provided for the second bank to be coupled to a selected memory cell in the second bank;

at least one fourth data line provided for the second bank, the fourth data line being arranged perpendicular to the third data line;

at least one second switch for selectively coupling the third data line to the fourth data line;

at least one common data line that is shared by the first and second banks, the common data line being arranged between the first and second banks;

a third switch for selectively coupling the second data line to the common data line in accordance with the bank select signal;

a fourth switch for selectively coupling the fourth data line to the common data line in accordance with the bank select signal;

an amplifier coupled to the common data line for amplifying data read from one of the memory cells, the amplifier being shared by the first and second banks; and an I/O line coupled to the amplifier for transmitting amplified data to an outer section.

21. The memory device as defined in claim 20, wherein the first bank includes a plurality of sub-arrays, and at least one of the first data lines is provided for each of the sub-arrays of the first bank, and the second bank includes a plurality of sub-arrays, and at least one of the third data lines is provided for each of the sub-arrays of the second bank.

22. The memory device as defined in claim 20, further comprising a write circuit coupled to the common data line and the I/O line for transmitting data from the I/O line to the common data line, the write circuit being shared by the first and second banks.

23. The memory device as defined in claim 20, further comprising:

a first write circuit coupled to the second data line and the I/O line, for transmitting data from the I/O line to the second data line; and a second write circuit coupled to the fourth data line and the I/O line, for transmitting data from the I/O line to the fourth data line.

24. The memory device as defined in claim 20, further comprising:

a first logic circuit coupled to the third switch, for controlling the third switch in accordance with the bank select signal and a data read signal; and a second logic circuit coupled to the fourth switch, for controlling the fourth switch in accordance with the data read signal and an inverse signal of the bank select signal.

25. The memory device as defined in claim 20, further comprising data input and output circuits electrically coupled to the I/O line.

26. The semiconductor memory device as defined in claim 1, wherein at least one switch is provided for each of the banks of memory cells.

27. The semiconductor memory device as defined in claim 1, wherein one of the switches is provided for each of the data lines in each of the banks.

28. The semiconductor memory device as defined in claim 1, wherein each of the switches is directly connected between one of the data lines and the common data line.

* * * * *